United States Patent
Lin

(10) Patent No.: US 9,070,895 B2
(45) Date of Patent: Jun. 30, 2015

(54) OLED PACKAGE AND PACKAGING METHOD THEREOF

(71) Applicant: HANNSTAR DISPLAY CORP., New Taipei (TW)

(72) Inventor: Chih-Pin Lin, Tainan (TW)

(73) Assignee: Hannstar Display Corp., Tainan (TW)

( * ) Notice: Subject to any disclaimer, the term of this patent is extended or adjusted under 35 U.S.C. 154(b) by 96 days.

(21) Appl. No.: 13/770,140

(22) Filed: Feb. 19, 2013

(65) Prior Publication Data

US 2013/0240848 A1 Sep. 19, 2013

(30) Foreign Application Priority Data

Mar. 19, 2012 (CN) .......................... 2012 1 0088176

(51) Int. Cl.
| | | |
|---|---|---|
| H01L 29/08 | (2006.01) | |
| H01L 51/00 | (2006.01) | |
| H01L 51/52 | (2006.01) | |
| H01L 33/52 | (2010.01) | |
| H01L 51/56 | (2006.01) | |

(52) U.S. Cl.
CPC .............. *H01L 51/52* (2013.01); *H01L 33/52* (2013.01); *H01L 51/56* (2013.01); *H01L 51/5259* (2013.01); *H01L 51/5256* (2013.01)

(58) Field of Classification Search
CPC ......... H01L 51/52; H01L 51/56; H01L 33/52; H01L 51/5256; H01L 51/5259
See application file for complete search history.

(56) References Cited

U.S. PATENT DOCUMENTS

| | | | | |
|---|---|---|---|---|
| 6,470,594 | B1* | 10/2002 | Boroson et al. ................. | 34/335 |
| 7,554,264 | B2* | 6/2009 | Choi et al. ..................... | 313/506 |
| 2003/0124764 | A1* | 7/2003 | Yamazaki et al. .............. | 438/99 |
| 2005/0046349 | A1 | 3/2005 | Tanaka et al. | |
| 2006/0022592 | A1* | 2/2006 | Boroson ....................... | 313/512 |
| 2006/0170341 | A1* | 8/2006 | Su et al. ........................ | 313/512 |
| 2007/0194711 | A1* | 8/2007 | Matsuura et al. ............. | 313/512 |
| 2009/0130941 | A1* | 5/2009 | Boroson et al. ................ | 445/25 |
| 2009/0215279 | A1* | 8/2009 | Kim et al. ..................... | 438/763 |
| 2009/0221109 | A1* | 9/2009 | Choi et al. ..................... | 438/33 |

FOREIGN PATENT DOCUMENTS

| | | |
|---|---|---|
| CN | 2613053 Y | 4/2004 |
| CN | 1589074 A | 3/2005 |
| CN | 1592509 A | 3/2005 |
| CN | 1816232 A | 8/2006 |

OTHER PUBLICATIONS

Communication From the Chinese Patent Office Regarding A Counterpart Foreign Application Dated Mar. 30, 2015.

* cited by examiner

*Primary Examiner* — Nicholas Tobergte
(74) *Attorney, Agent, or Firm* — Rosenberg, Klein & Lee

(57) ABSTRACT

There is provided an OLED package including a substrate, a lighting component, a compound barrier layer, a moisture absorption zone and an inorganic barrier layer. The lighting component is formed on the substrate. The compound barrier layer completely seals the lighting component configured to block moisture and oxygen. The moisture absorption zone is formed on the substrate surrounding the compound barrier layer and is not formed upon the lighting component. The inorganic barrier layer completely seals the compound barrier layer and the moisture absorption zone configured to block moisture and oxygen.

11 Claims, 7 Drawing Sheets

OLED PACKAGE AND PACKAGING METHOD THEREOF

CROSS REFERENCE TO RELATED APPLICATION

This application claims the priority benefit of Chinese Patent Application Number 201210088176.8, filed on Mar. 19, 2012, the full disclosure of which is incorporated herein by reference.

BACKGROUND

1. Field of the Disclosure

This disclosure generally relates to an organic light emitting diode (OLED) structure and, more particularly, to an OLED package and a packaging method thereof.

2. Description of the Related Art

As the organic light emitting diode display (OLED display) has the superiority of high color saturation, high brightness and wide viewing angle, it becomes a popular product in the next generation display market. However, the OLED device can be easily damaged by the invasion of moisture and oxygen to decrease the service life. Therefore, how to prevent moisture and oxygen from invading into the OLED device is an important research topic in this field.

FIG. 1A shows a conventional OLED package which includes a glass substrate 71, an OLED device 72 formed on the glass substrate 71, a metal cover 73 covering upon the OLED device 72 configured to block moisture and oxygen, a sealant 74 configured to combine the glass substrate 71 and the metal cover 73 and a moisture absorbent 75 disposed upon the OLED device 72 configured to absorb moisture. However in this structure, as the metal cover 73 is opaque to light, it can not be applied to the top emission type OLED device. In addition, the sealant 74 further has the problem of unable to block moisture effectively.

FIG. 1B shows another conventional OLED package which includes a flexible substrate 81, an OLED device 82 formed on the flexible substrate 81, a glass cover 83 covering upon the OLED device 82 and a glass cement 84 configured to combine the glass substrate 81 and the glass cover 83. However, in this structure the glass thickness is difficult to be reduced and the manufacturing stability of the glass cement 84 is not good enough to be applied to large size panels. Thus, this structure is only suitable for small size displays.

FIG. 1C shows another conventional OLED package which includes a substrate 91, an OLED device 92 formed on the substrate 91, a first barrier layer 93 formed on the OLED device 92 to block moisture and oxygen and a second barrier layer 94 formed between the OLED device 92 and the substrate 91 to block moisture. Although this structure can significantly reduce the device thickness, moisture ($H_2O$) and Oxygen ($O_2$) still have the chance to invade into the structure to damage the OLED device 92.

Accordingly, the present disclosure further provides an OLED package and a packaging method thereof that may solve the problems in the conventional OLED package and extend the service life of the OLED device.

SUMMARY

It is an object of the present disclosure to provide an OLED package and a packaging method thereof that can reduce the number of stacked layers of the organic barrier layer and the inorganic barrier layer so as to reduce the package thickness and improve the optical property.

It is another object of the present disclosure to provide an OLED package and a packaging method thereof that disposes moisture absorbent in the unused space of the package structure to so as to effectively reduce the chance of the moisture invading into the lighting component.

The present disclosure provides an OLED package including a substrate, a lighting component, a compound barrier layer, a moisture absorption zone and an inorganic barrier layer. The lighting component is formed on the substrate. The compound barrier layer completely seals the lighting component to block moisture and oxygen. The moisture absorption zone is formed on the substrate and surrounding the compound barrier layer but is not formed upon the lighting component. The inorganic barrier layer completely seals the compound barrier layer and the moisture absorption zone to block moisture and oxygen.

The moisture absorption zone is configured to prolong the invasion path of moisture and oxygen. As the moisture absorption zone is disposed aside of the lighting component, the optical property (e.g. transmittance and colorimetric shift) of the lighting component is not influenced thereby. When unpreventable moisture and oxygen invasion occurs, most of the moisture and oxygen are absorbed by the moisture absorption zone surrounding the lighting component and do not accumulate upon the lighting component to cause dark spot.

The present disclosure further provides a packaging method of an OLED package including the steps of: providing a substrate; forming a lighting component on the substrate; sealing the lighting component with a compound barrier layer to block moisture and oxygen; forming a moisture absorption zone on the substrate and surrounding the compound barrier layer, wherein the moisture absorption zone is not formed upon the lighting component; and sealing the compound barrier layer and the moisture absorption zone with an inorganic barrier layer to block moisture and oxygen.

The moisture absorption zone is configured to prolong the invasion path of moisture and oxygen. As the moisture absorption zone is disposed aside of the lighting component, the influence on the optical property (e.g. transmittance and colorimetric shift) of the top emission type OLED can be reduced. When unpreventable moisture and oxygen invasion occurs, most of the moisture and oxygen are absorbed by the moisture absorption zone surrounding the OLED device and do not accumulate upon the OLED device to cause dark spot.

The present disclosure further provides a packaging method of an OLED package including the steps of: providing a substrate; forming a lighting component on the substrate; sealing the lighting component with a compound barrier layer to block moisture and oxygen; forming a plastic frame on the substrate surrounding the compound barrier layer; forming a moisture absorption zone on the substrate between the compound barrier layer and the plastic frame using liquid drop method; and sealing the compound barrier layer, the moisture absorption zone and the plastic frame with an inorganic barrier layer to block moisture and oxygen.

The moisture absorption zone is configured to prolong the invasion path of moisture and oxygen. As the moisture absorption zone is disposed aside of the lighting component, the influence on the optical property (e.g. transmittance and colorimetric shift) of the top emission type OLED can be reduced. When unpreventable moisture and oxygen invasion occurs, most of the moisture and oxygen are absorbed by the moisture absorption zone surrounding the OLED device and do not stay upon the OLED device to cause dark spot.

In the OLED package and the packaging method of the present disclosure, an organic buffer layer may further be coated on an upper surface of the lighting component so as to increase the flatness of the upper surface and protect the lighting component in the following process, wherein the lighting component is an OLED device and the substrate may be made of materials including metal, glass or plastic.

In the OLED package and the packaging method of the present disclosure, the compound barrier layer is formed by alternatively forming at least one inorganic film layer and at least one organic film layer outside the lighting component using thermal evaporation, sputtering deposition or coating method.

In the OLED package of the present disclosure, when moisture outside the OLED package passes through the outermost inorganic barrier layer and enters the compound barrier layer, the invaded moisture is absorbed by the moisture absorption zone following possible paths in the compound barrier layer without further invading into the lighting component such that the service life can be significantly extended and the total thickness of the package structure will not be increased. Therefore, the moisture absorption zone is preferably formed by moisture absorbent having strong moisture absorbing ability.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1A:
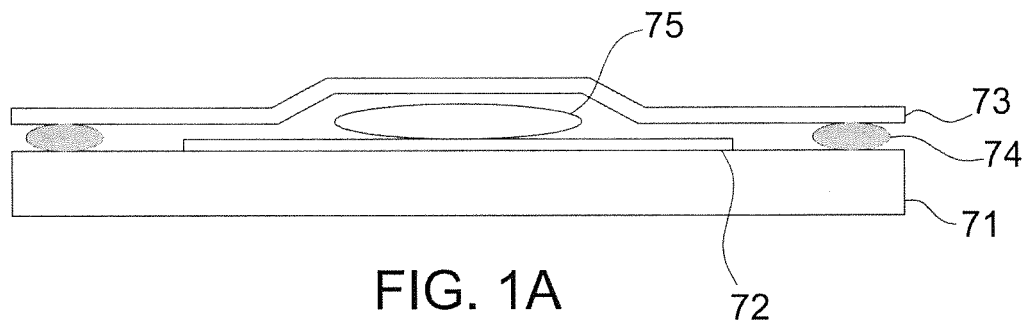
FIGS. 1A-1C show schematic diagrams of conventional OLED packages.
Figure 1B:
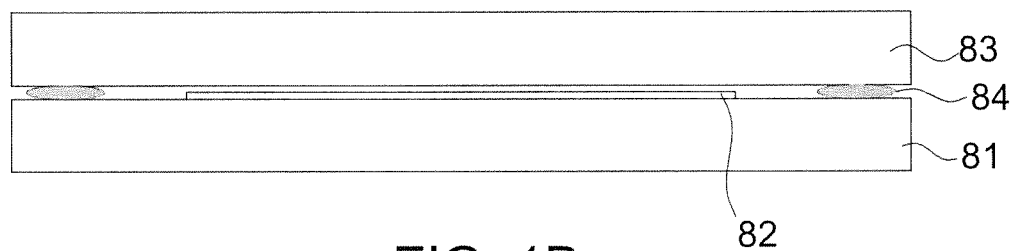
Figure 1C:
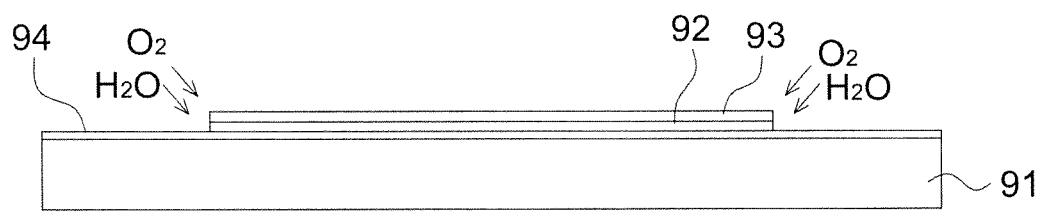
Figure 2:
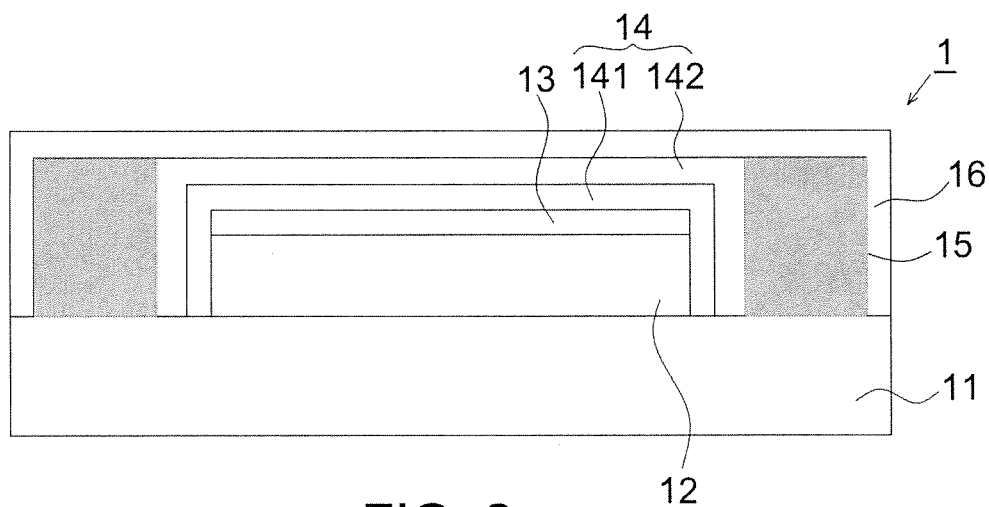
FIG. 2 shows a schematic diagram of the OLED package according to a first embodiment of the present disclosure.

Referring to FIG. 2, it shows a schematic diagram of the organic light emitting diode (OLED) package according to a first embodiment of the present disclosure. The OLED package 1 includes a substrate 11, a lighting component 12, an organic buffer layer 13, a compound barrier layer 14, a moisture absorption zone 15 and an inorganic barrier layer 16.

The lighting component 12 is an OLED device and formed on the substrate 11. It is appreciated that the lighting component 12 generally has two electrodes (i.e. anode and cathode) and an organic emitting layer sandwiched between the two electrodes. The two electrodes and the organic emitting layer are sequentially formed on the substrate 11 by, for example vapor deposition or coating, wherein the structure and the manufacturing method of the lighting component 12 are well known to the art and thus details thereof are not described herein.

The organic buffer layer 13 may be a metal complex such as NPB or CuPc which is directly formed on an upper surface of the lighting component 12 by, for example vapor deposition or coating and sandwiched between the lighting component 12 and the compound barrier layer 14. The organic buffer layer 13 is configured to improve the flatness of the upper surface of the lighting component 12 and protect the lighting component 12 in the following process such as forming the compound barrier layer 14 thereon. In the following two embodiments of the present disclosure, the OLED package may not include the organic buffer layer 13.

The compound barrier layer 14 is formed by alternatively forming at least one inorganic film layer 141 and at least one organic film layer 142 using, for example vapor deposition, sputtering deposition, atomic layer deposition and/or coating to completely cover the lighting component 12 in order to block moisture and oxygen, wherein a layer number of the inorganic film layer 141 and the organic film layer 142 may be determined according to actual requirements. More layers can have a better blocking effect toward moisture and oxygen but the thickness of the package structure will be increased and the optical performance will be deceased; on the contrary, fewer layers can reduce the thickness of the package structure and improve the optical performance, but the blocking effect toward moisture and oxygen will be decreased. The method of forming the compound barrier layer 14 by using vapor deposition, sputtering deposition, atomic layer deposition or coating is well known to the art and thus details thereof is not described herein. A thickness of the organic film layer 142 may be between 100-10000 nm and the organic film layer 142 is configured to increase the adhesion between inorganic layers, absorb stress between inorganic layers and increase the surface flatness. A thickness of the inorganic film layer 141 may be between 10-1000 nm and the inorganic film layer 141 is configured to block moisture and oxygen. The inorganic film layer 141 and the organic film layer 142 may be selected from at least one of acryl-based resin, epoxy-based resin, polymide, polyethylene (PE), polypropylene (PP), polyvinyl chloride (PVC) and polystyrene (PS), but not limited thereto.

The moisture absorption zone 15 is formed on the substrate 11 and surrounding the compound barrier layer 14 but is not formed upon the lighting component 12 so as not to degrade the optical property thereof and in order to reduce the total thickness. As the region aside to the compound barrier layer 14 does not have any particular function, disposing the moisture absorption zone 15 at that region can effectively use space and will not increase the total thickness of the package structure. In the first embodiment, the moisture absorption zone 15 may be at least one of calcium chloride, silicone, bamboo carbon and activated carbon, a polymer moisture absorbent selected from the group consisting of $SiO_2$, starch series, fiber strand, synthetic polymer, polyacrylate series, polyvinyl alcohol series and polyacrylamide series and a moisture absorbent selected from the group consisting of SiO, BaO, CaO and $Al_2O_3$, wherein the starch series may be starch-acrylic acid salt graft copolymer; the fiber strand may be salvianolic-acrylic acid graft copolymer; the synthetic polymer may be acrylic acid polymer, acrylic acid-acrylic copolymer, acrylic acid-vinyl alcohol copolymer, acrylic acid-acrylamide copolymer, acrylic acid-maleic acid copolymer and polyoxyethylene polymer, but not limited thereto.

The inorganic barrier layer 16 completely seals the compound barrier layer 14 and the moisture absorption zone 15 and functions as the outermost layer for blocking moisture and oxygen.

In the first embodiment, when moisture outside the OLED package 1 passes though the inorganic barrier layer 16 to enter the compound barrier layer 14 (more specifically the organic film layer 142), the invaded moisture will follow possible paths in the compound barrier layer 14 to be absorbed by the moisture absorption zone 14 and does not further invade into the lighting component 12. Therefore, the service life can be effectively extended and the total thickness of the package structure will not be increased.

Figure 3:
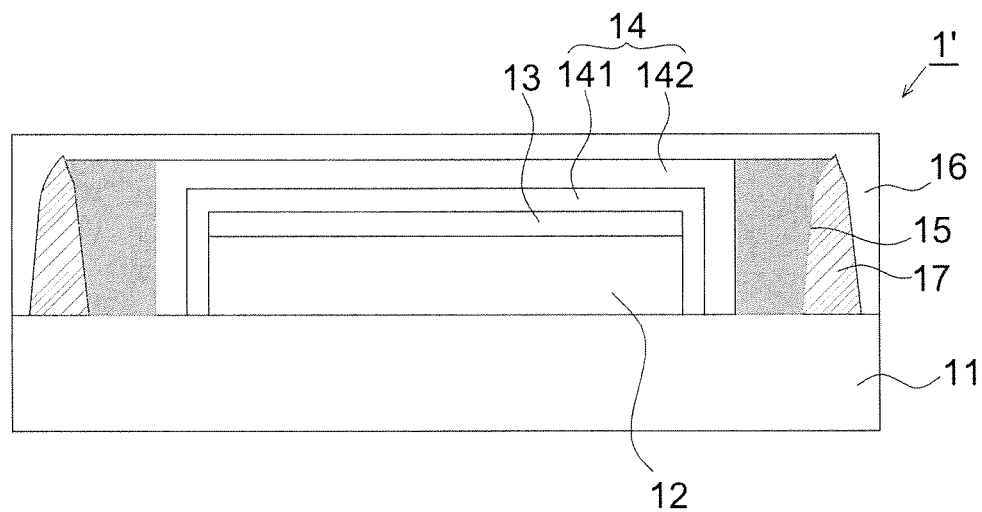
FIG. 3 shows a schematic diagram of the OLED package according to a second embodiment of the present disclosure.

As shown in FIG. 3, it shows a schematic diagram of the OLED package according to a second embodiment of the present disclosure. The OLED package 1' also includes the substrate 11, the lighting component 12, the organic buffer layer 13, the compound barrier layer 14, the moisture absorption zone 15 and the inorganic barrier layer 16. In addition, the OLED package 1' further includes a plastic frame 17 formed on the substrate 11 and surrounding the moisture absorption zone 15. The plastic frame 17 is configured to prevent material of the moisture absorption zone 15 from leaking outside during manufacturing. Preferably, the plastic frame 17 is away from the edge of the substrate 12 by a predetermined distance such that the inorganic barrier layer 16 can be formed outside the plastic frame 17, wherein the plastic frame 17 may be, for example a thermal-curing adhesive or a UV-curing adhesive. In addition, the structure and the manufacturing method of other elements are similar to those of the first embodiment and thus details thereof are not repeated herein. In the second embodiment, the inorganic barrier layer 16 is formed upon the compound barrier layer 14 and the moisture absorption zone 15 and is formed upon and surrounding the plastic frame 17 so as to completely seal the compound barrier layer 14, the moisture absorption zone 15 and the plastic frame 17 thereby effectively blocking moisture and oxygen.

Similarly, in the second embodiment when moisture outside the OLED package 1' passes though the inorganic barrier layer 16 to enter the compound barrier layer 14 (more specifically the organic film layer 142), the invaded moisture will follow possible paths in the compound barrier layer 14 to be absorbed by the moisture absorption zone 14 and does not further invade into the lighting component 12. Therefore, the service life can be effectively extended and the total thickness of the package structure will not be increased.

Figure 4A:
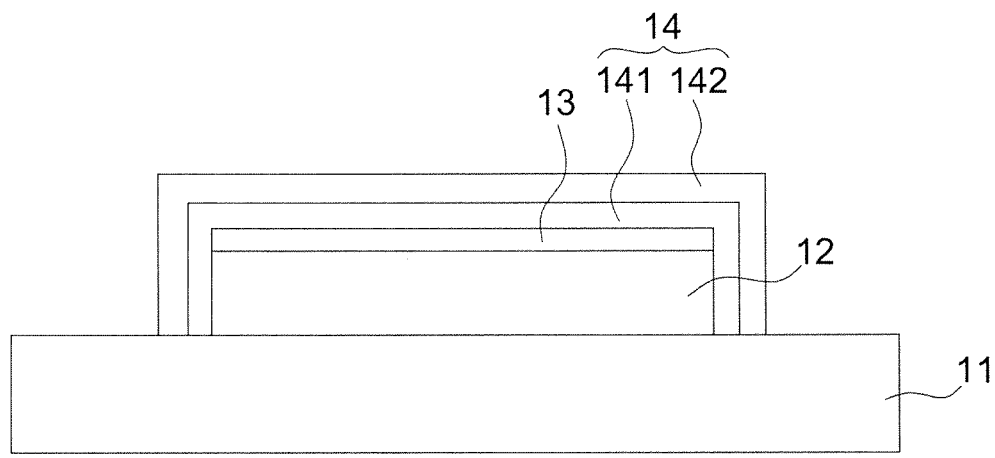
FIGS. 4A-4F show schematic diagrams of the packaging method of the OLED package according to the two embodiments of the present disclosure.
Figure 4B:
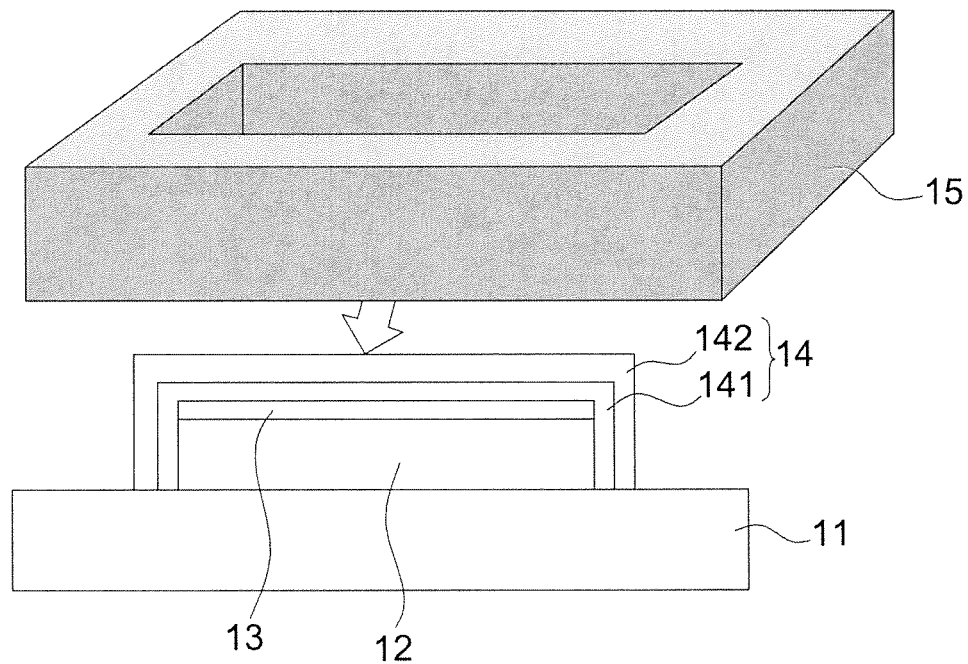
Figure 4C:
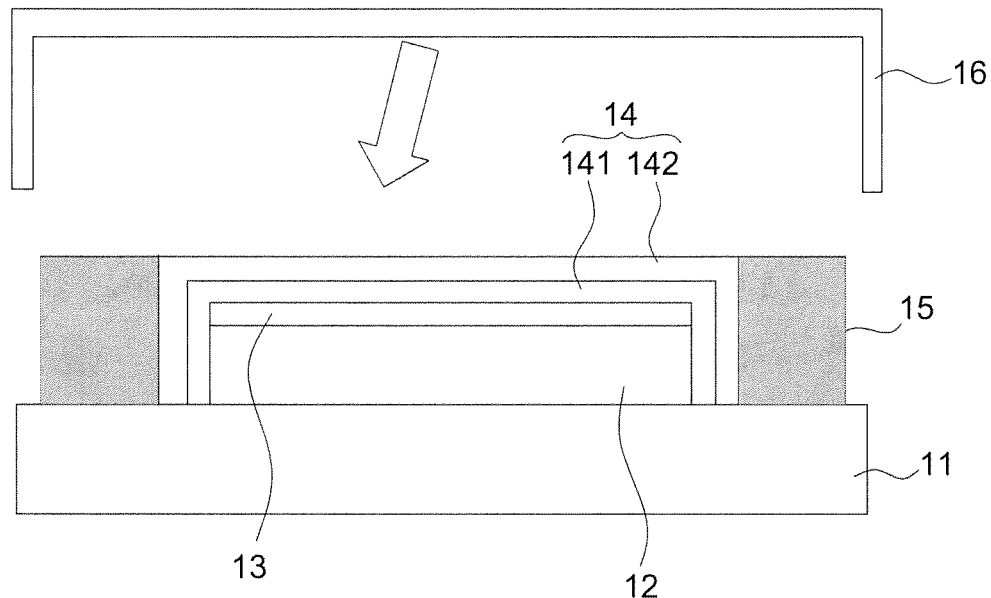
Figure 5:
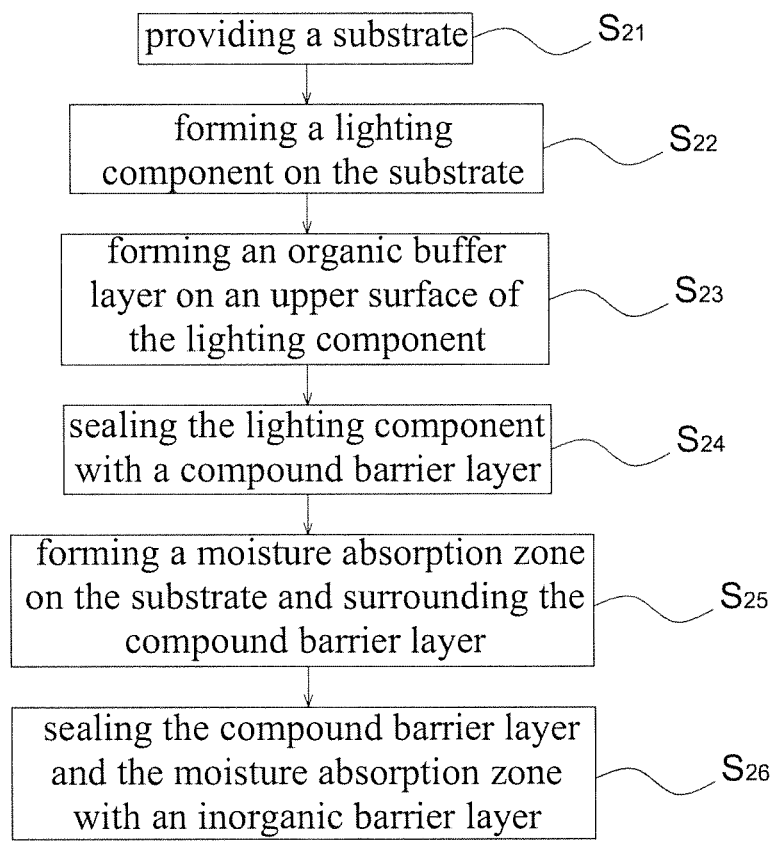
FIGS. 5-6 show flow charts of the packaging method of the OLED package according to the two embodiments of the present disclosure.

FIGS. 4A to 4C show schematic diagrams of the packaging method of the OLED package 1 according to the first embodiment of the present disclosure; and FIG. 5 shows a flow chart of the packaging method of the OLED package 1 according to the first embodiment of the present disclosure including the following steps.

As shown in FIG. 4A, at first a substrate 11 is provided (Step $S_{21}$). Then a lighting component 12 is formed on the substrate 11 (Step $S_{22}$), wherein the structure and the manufacturing of the lighting component 12 is well known to the art and thus details thereof are not described herein. An organic buffer layer 13 is formed on an upper surface of the lighting component 12 by, for example vapor deposition or coating so as to improve the flatness of the upper surface and protect the lighting component 12 in the following process (Step $S_{23}$), wherein this step may not be implemented. A compound barrier layer 14 is sealed outside the lighting component 12 using, for example vapor deposition, sputtering deposition or coating so as to block moisture and oxygen (Step $S_{24}$). In addition, if the organic buffer layer 13 is formed on the lighting component 12, the compound barrier layer 14 is formed upon the organic buffer layer 13 and surrounding the lighting component 12.

As shown in FIG. 4B, a moisture absorption zone 15 is formed on the substrate 11 surrounding the compound barrier layer 14 (Step $S_{25}$), wherein a thickness of the moisture absorption zone 15 is preferably larger than that of the lighting component 12 and the moisture absorption zone 15 is not formed upon the lighting component 12 in order not to influence the optical property and increase the thickness thereof. In the first embodiment, the moisture absorption zone 15 is a solid film initially and then heated to become a semi-solid state. Therefore, the step of forming the moisture absorption zone 15 may further include the steps of: disposing and fixing a solid film surrounding the compound barrier layer 14; heating the solid film to become a semi-solid state; and cold curing the film having the semi-solid state to form the moisture absorption zone 15. According to the material used, UV-curing may be performed in this step.

In the first embodiment, the moisture absorption zone 15 may also be directly formed surrounding the compound barrier layer 14 using, for example electron beam vapor deposition, chemical vapor deposition, thermal evaporation, sputtering deposition, coating or plasma deposition without using the solid film, which is in a solid state under normal temperature. The merit of the first embodiment is that the moisture absorption zone 15 is formed in the unused space on the substrate 11 so as to achieve purposes of effectively using the space and absorbing moisture.

As shown in FIG. 4C, finally an inorganic barrier layer 16 is formed outside the compound barrier layer 14 and the moisture absorption zone 15 (Step $S_{26}$) so as to completely seal the compound barrier layer 14 and the moisture absorption zone 15 thereby blocking moisture effectively, wherein similarly to the compound barrier layer 14 the inorganic barrier layer 16 may be formed by, for example vapor deposition, sputtering deposition or coating and configured to serve as the outermost layer for blocking moisture and oxygen.

Figure 6:
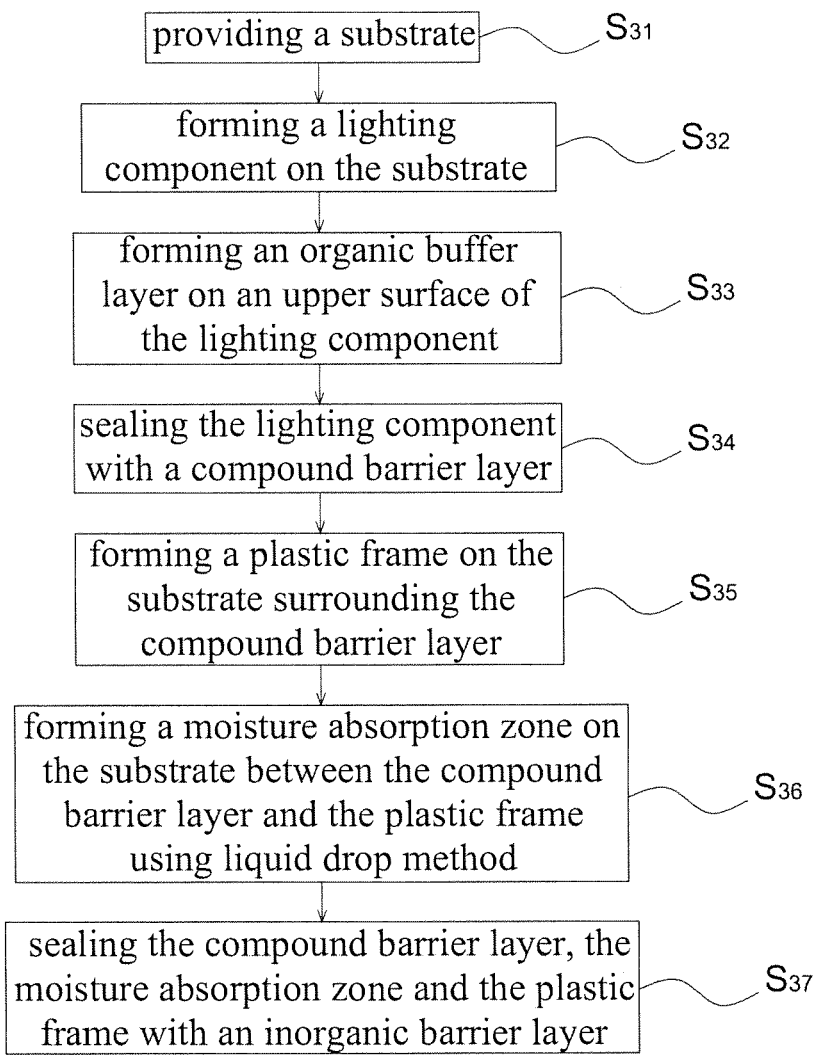

Referring to FIGS. 4A, 4D-4F and 6, FIGS. 4A and 4D-4F show schematic diagrams of the packaging method of the OLED package 1' according to the second embodiment of the present disclosure; and FIG. 6 shows a flow chart of the packaging method of the OLED package 1' according to the second embodiment of the present disclosure including the following steps.

As shown in FIG. 4A, at first a substrate 11 is provided (Step $S_{31}$). Then a lighting component 12 is formed on the substrate 11 (Step $S_{32}$). An organic buffer layer 13 is formed on the upper surface of the lighting component 12 by, for example vapor deposition or coating so as to improve the flatness of the upper surface and protect the lighting component 12 in the following process (Step $S_{33}$), wherein this step may not be implemented. A compound barrier layer 14 is sealed outside the lighting component 12 using, for example vapor deposition, sputtering deposition or coating so as to block moisture and oxygen (Step $S_{34}$). In addition, if the organic buffer layer 13 is formed on the lighting component 12, the compound barrier layer 14 is formed upon the organic buffer layer 13 and aside to the lighting component 12. The steps $S_{31}$-$S_{34}$ of the second embodiment is similar to the steps $S_{21}$-$S_{24}$ of the first embodiment.

Figure 4D:
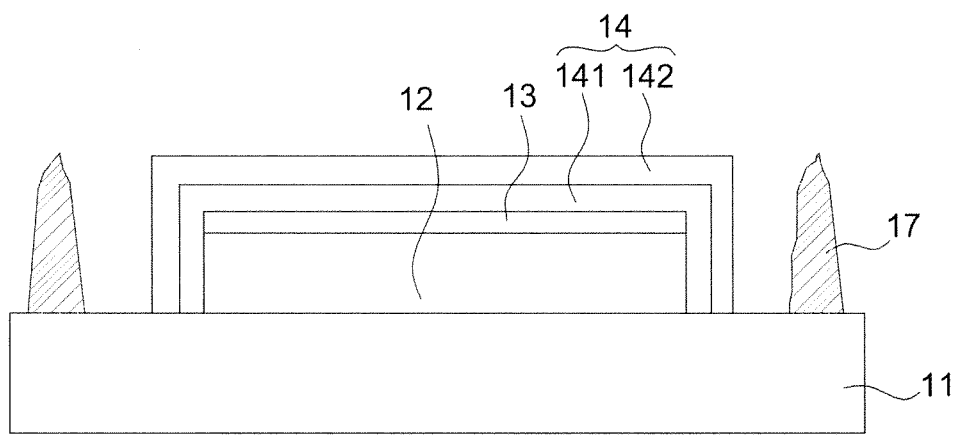

As shown in FIG. 4D, next a plastic frame 17 is formed on the substrate 11 and surrounding the compound barrier layer 14, wherein the plastic frame 17 may be, for example a thermal-curing adhesive or a UV-curing adhesive. It is appreciated that if the thermal-curing adhesive is used, the plastic frame 17 needs to be heated; if the UV-curing adhesive is used, the plastic frame 17 needs to be illuminated by UV light during manufacturing. The plastic frame 17 is preferably away from the edge of the substrate 11 by a predetermined distance such that the inorganic barrier layer 16 can be completely sealed outside the plastic frame 17 so as to achieve good blocking effect.

Figure 4E:
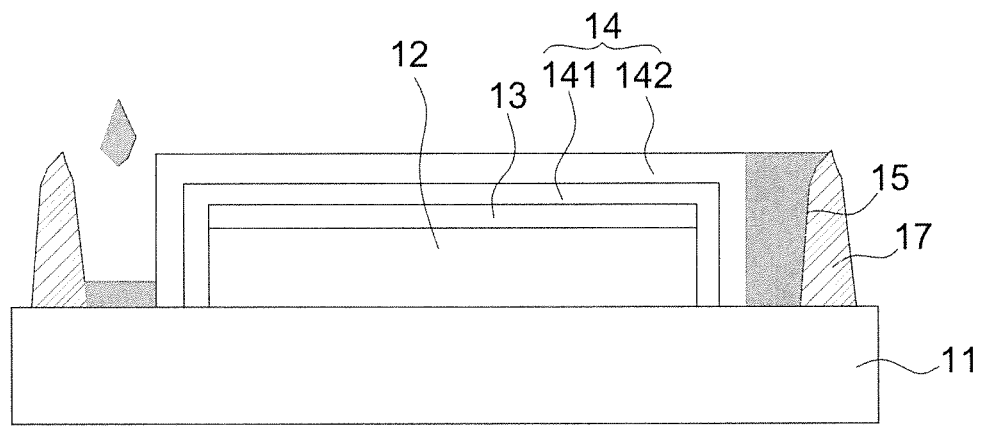

As shown in FIG. 4E, next a moisture absorption zone 15 is formed on the substrate 11 between the compound barrier layer 14 and the plastic frame 17 using liquid drop method (Step $S_{36}$), wherein the plastic frame 17 is configured to prevent material of the moisture absorption zone 15 in a melted state from leaking outside during manufacturing. It is appreciated that in this step the material of the moisture absorption zone 15 may be liquid drop in a high temperature environment and then cured by cold curing or UV-curing so as to cure the moisture absorbent in the melted state.

Figure 4F:
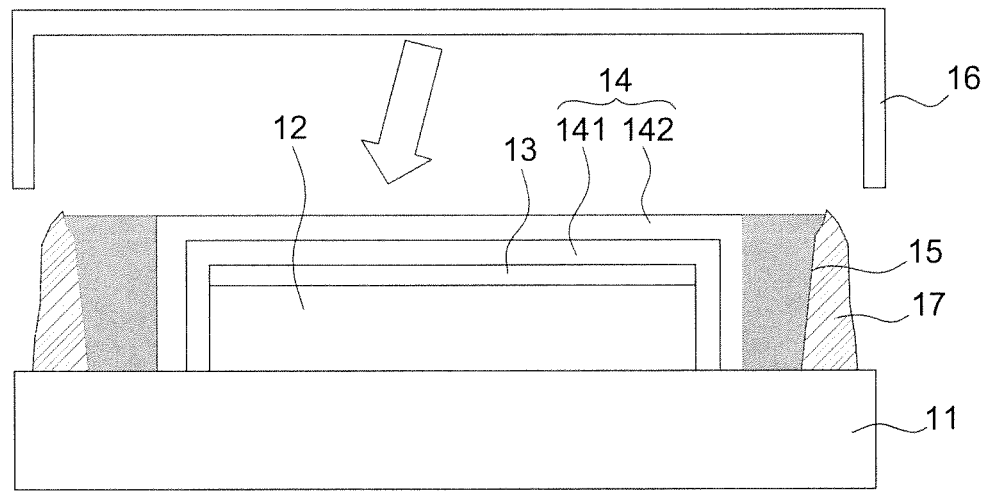

As shown in FIG. 4F, finally an inorganic barrier layer 16 is formed outside the compound barrier layer 14, the moisture absorption zone 15 and the plastic frame 17 (Step $S_{37}$), wherein similar to the compound barrier layer 14 the inorganic barrier layer 16 may be formed, for example by vapor deposition, sputtering deposition or coating to be served as the outermost layer for blocking moisture and oxygen. In the second embodiment, as the plastic frame 17 may not have enough moisture blocking ability, the inorganic barrier layer 16 is preferably completely seal the compound barrier layer 14, the moisture absorption zone 15 and the plastic frame 17 to achieve good blocking effect.

It should be mentioned that the size of every element in the drawings has been adjusted so as to clearly show every element but it is not used to limit the present disclosure.

As mentioned above, the conventional OLED package has the problems of large thickness and low ability to block moisture and oxygen. Therefore, the present disclosure further provides an OLED package (FIGS. 2 and 3) and a packaging method thereof (FIGS. 5 and 6) that can effectively prevent moisture and oxygen from invading into the lighting component and has a low package thickness and a good optical property.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An OLED package, comprising:
   a substrate;
   a lighting component formed on the substrate;
   a compound barrier layer completely sealing the lighting component to block moisture and oxygen;
   a moisture absorption zone formed on the substrate and surrounding the compound barrier layer but not formed upon the lighting component;
   an inorganic barrier layer completely sealing the compound barrier layer and the moisture absorption zone; and
   an organic buffer layer between the lighting component and the compound barrier layer.

2. The OLED package as claimed in claim 1, wherein the compound barrier layer comprises at least one inorganic film layer and at least one organic film layer.

3. The OLED package as claimed in claim 1, wherein a plastic frame is further formed on the substrate surrounding the moisture absorption zone.

4. The OLED package as claimed in claim 3, wherein the plastic frame is at least one of a thermal-curing adhesive and a UV-curing adhesive.

5. The OLED package as claimed in claim 1, wherein the moisture absorption zone is selected from at least one of calcium chloride, silicone, bamboo carbon, activated carbon, a polymer moisture absorbent selected from the group consisting of $SiO_2$, starch series, fiber strand, synthetic polymer, polyacrylate series, polyvinyl alcohol series and polyacrylamide series and a moisture absorbent selected from the group consisting of SiO, BaO, CaO and $Al_2O_3$.

6. A packaging method of an OLED package, comprising:
   providing a substrate;
   forming a lighting component on the substrate;
   forming an organic buffer layer on an upper surface of the lighting component;
   completely sealing the lighting component with a compound barrier layer to block moisture and oxygen, wherein the organic buffer layer is between the lighting component and the compound barrier layer;
   forming a moisture absorption zone on the substrate and surrounding the compound barrier layer, wherein the moisture absorption zone is not formed upon the lighting component; and
   completely sealing the compound barrier layer and the moisture absorption zone with an inorganic barrier layer.

7. The packaging method as claimed in claim 6, wherein the operation of forming a moisture absorption zone includes:
   disposing a solid film surrounding the compound barrier layer;
   heating the solid film to a semi-solid state; and
   cold curing to form the moisture absorption zone.

8. The packaging method as claimed in claim 6, wherein the moisture absorption zone is formed by electron beam vapor deposition, chemical vapor deposition, thermal evaporation, sputtering deposition, coating or plasma deposition.

9. The packaging method as claimed in claim 6, wherein, in the operation of sealing the lighting component with a compound barrier layer, at least one inorganic film layer and at least one organic film layer are alternatively formed on the lighting component by thermal evaporation, sputtering deposition, or coating.

10. A packaging method of an OLED package, comprising:
    providing a substrate;
    forming a lighting component on the substrate;
    forming an organic buffer layer on an upper surface of the lighting component;
    completely sealing the lighting component with a compound barrier layer to block moisture and oxygen, wherein the organic buffer layer is between the lighting component and the compound barrier layer;
    forming a plastic frame on the substrate surrounding the compound barrier layer;
    forming a moisture absorption zone on the substrate surrounding the compound barrier layer and between the compound barrier layer and the plastic frame using a liquid drop method, wherein the moisture absorption zone is not formed upon the lighting component; and
    completely sealing the compound barrier layer, the moisture absorption zone, and the plastic frame with an inorganic barrier layer.

11. The packaging method as claimed in claim 10, wherein, in the operation of sealing the lighting component with a compound barrier layer, at least one inorganic film layer and at least one organic film layer are alternatively formed on the lighting component by thermal evaporation, sputtering deposition, or coating.

* * * * *